United States Patent [19]

Dannatt et al.

[11] Patent Number: 4,728,999
[45] Date of Patent: Mar. 1, 1988

[54] LIGHT EMITTING DIODE ASSEMBLY

[75] Inventors: Hugh St. L. Dannatt, Bethel; Donald T. Dolan, Ridgefield; Henry Stalzer, Danbury, all of Conn.

[73] Assignee: Pitney Bowes Inc., Stamford, Conn.

[21] Appl. No.: 491,342

[22] Filed: May 5, 1983

Related U.S. Application Data

[63] Continuation of Ser. No. 162,968, Jun. 25, 1980, abandoned.

[51] Int. Cl.⁴ .................. H01L 33/00; H01L 23/48
[52] U.S. Cl. .................................. 357/17; 357/68; 313/500; 313/512
[58] Field of Search ............... 357/17, 32, 68, 70; 313/500, 512

[56] References Cited

U.S. PATENT DOCUMENTS

| | | | |
|---|---|---|---|
| 3,438,057 | 4/1969 | Neitzel | 346/107 OR |
| 3,760,237 | 9/1973 | Jaffe | 357/17 X |
| 3,806,777 | 4/1974 | Edmunds | 357/170 R |
| 3,877,052 | 4/1975 | Dixon et al. | 357/17 OR |
| 4,011,575 | 3/1977 | Groves | 357/80 |
| 4,062,698 | 12/1977 | Blakeslee et al. | 357/80 |
| 4,100,562 | 7/1978 | Sugawara et al. | 357/17 X |
| 4,165,474 | 8/1979 | Myers | 357/17 X |
| 4,240,090 | 12/1980 | Hughes et al. | 357/17 X |
| 4,241,360 | 12/1980 | Hambor et al. | 357/80 |
| 4,318,597 | 3/1982 | Kotani et al. | 354/5 |
| 4,322,735 | 3/1982 | Sadamasa et al. | 357/80 |

FOREIGN PATENT DOCUMENTS 1924209  1/1971  Fed. Rep. of Germany.

OTHER PUBLICATIONS

B. A. Bales, "A Scanned GaAsP Display System", IEE—Displays, 1971, pp. 103-107.
T. J. Harris, "Optical Printer", IBM Technical Disclosure Bulletin, vol. 13, No. 12, May, 1971.

Primary Examiner—J. Carroll
Attorney, Agent, or Firm—Peter Vrahotes; Melvin J. Scolnick; David E. Pitchenik

[57]  ABSTRACT

This invention relates to apparatus for electronically recording using a xerographic machine and, more particularly, to an assembly of monoliths containing light emitting diodes (LED's) that yields a relatively long array of LED's with high light density and a contiguous set of light centers. A fiber optic cover is placed over the exposed surfaces of the LED's to counter the effects of the divergent angle of light emitting from the LED's and to protect the LED's from damage. A gel having a relatively high refractive index is applied between the LED's and the fiber optic cover to further counter the effects of the divergent angle of light.

2 Claims, 3 Drawing Figures

LIGHT EMITTING DIODE ASSEMBLY

This is a continuation of application Ser. No. 162,968, filed June 25, 1980 and now abandoned.

BACKGROUND OF THE INVENTION

Light emitting diodes (LED's) have a multiplicity of uses, among which is the application of light in the printing industry. For example, LED's may be used in combination with xerographic copiers, photographic film, and the like for the purpose of recording an image of a message that is transmitted electronically. The use of LED's for this purpose has certain drawbacks. Primarily, high density light is required in such printing applications in order to obtain good contrast and high resolution, but the light output of individual LED's is not high. Consequently, a large number of LED's must be placed in a small area to provide the required high light density. This has proven difficult to achieve because of the size constraints imposed by the crystalline structure involved. More specifically, a major drawback to the use of LED's is that the length of the monoliths from which LED's are made is limited. This is because the LED's are formed upon monoliths that are of monocrystalline form. Because of the methods required to form the monocrystalline material, a limitation is placed upon the size of monoliths which can be made. Present techniques of manufacturing can achieve a monocrystalline boule three inches in diameter, thus limiting the length of a monolith to approximately three inches in length. The most commonly commercially used crystalline boules for LED fabrication are only somewhat larger than one inch in diameter, thus limiting the length even more greatly. Many techniques have been used in an attempt to overcome these shortcomings, but to date none has proven completely satisfactory.

Another problem associated with the use of LED's in the printing industry is their fragile nature, particularly the electrical connections for such LED's. In order to assure that the amount of light emitted to the receiving surface is high, the LED's are placed as close to the surface as possible. This increases the possibility of damage to the LED's because of their movement relative to the receiving surface.

SUMMARY OF THE INVENTION

It has been found that an LED assembly having a high light density may be obtained by forming the LED's within a monolith in rows in such a manner that the individual LED's of one row are laterally staggered relative to the LED's in the other row. In addition, the monoliths from which the assembly is made have their ends cut at an angle and are assembled together so that the units can be joined to form a required length while achieving a set of centers. In addition, a fiber optic cover is placed over the exposed surface of the LED's so as to transmit light columnarly from the LED to the light receiving surface and to protect the LED's from being damaged by inadvertant contact with the light receiving surface. A gel with a relatively high refractive index is applied between the LED's and the fiber optic cover to counter the effects of the divergent angle of light emitting from the LED's.

DETAILED DESCRIPTION OF THE INVENTION

Figure 1:
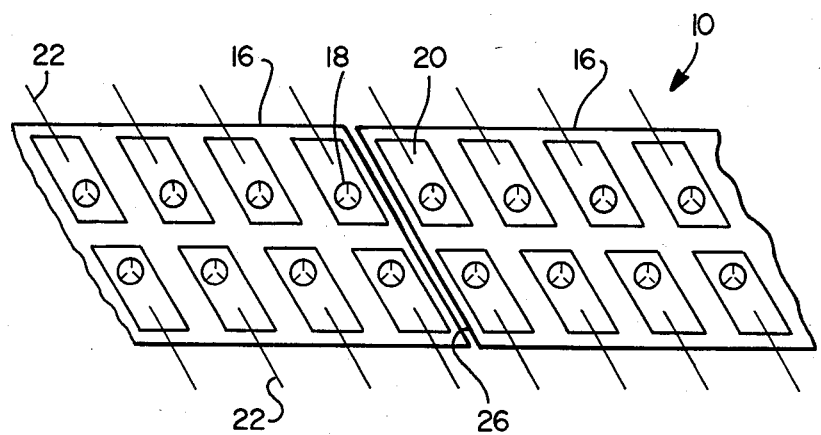
FIG. 1 shows portions of a pair of adjacent monoliths that incorporate features of the present invention.
Figure 2:
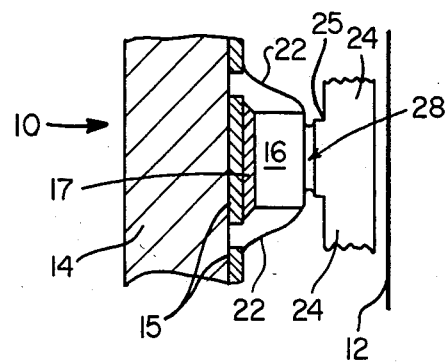
FIG. 2 shows a partial, cross-sectional view of an LED assembly that incorporates features of the present invention, the assembly shown addressing a receiving surface.

Referring now to FIGS. 1 and 2, an assembly of monoliths having LED's found thereon is shown generally at 10 spaced relative to a surface 12 such as a photoconductive belt or drum made of zinc oxide, selenium, cadmium sulfide and the like. The assembly 10 includes a substrate 14 made of a dielectric material such as aluminum oxide ($Al_2O_3$) with a conductive material 15 applied to portions of the surface thereof. A plurality of n-type monoliths 16 are attached to the conductive material 15 by an adhesive 17 such as silver epoxy. The monoliths 16 are made of a material such as gallium arsenide and have a number of doped locations to create p-type sites 18 which in combination with the monolith define light emitting diode (LED's). The doping is accomplished in such a fashion that the p-type sites of LED's 18 are located along two rows, each of which is adjacent the longitudinal edge of a monolith 16. The LED sites 18 of one row are laterally staggered relative to the LED's of the opposite row, as seen in FIG. 1. Although the LED sites are shown as being circular, it will be appreciated that non-circular sites, such as elliptical, may be fashioned for occasions when non-square resolution is required. According to the instant invention, a one inch length would have eight monoliths 16 with thirty-two LED sites situated on each monolith. The monoliths 16 are joined together at their ends to form the required assembly 10 inch length. For example, if an eight inch assembly is required, sixty-four monoliths would be assembled end to end in tandem fashion to produce 2048 LED sites 18.

A metallic coating 20 is deposited upon the monolith 16 at the location of each of the LED sites 18, an open portion being formed in each coating to allow exposure of the LED's. A lead 22 provides electrical connection between the conductive material 15 and the metallic coatings 20 so as to allow the supplying of power to each LED. The leads 22 may be either soldered or epoxy bonded to the conductive material 15 and metallic coatings 20. A fiber optic cover 24 is placed over the length of the monoliths 16 intermediate the monoliths and the photoconductive surface 12. The fiber optic cover 24 has relief portions 25 that extend the length of the cover and are located above the locations where the leads 22 are connected to the metallic coatings 20. The fiber optic cover 24 may be made of either glass or methylmethacrylate. A gel 28 having a refractive index greater than one is applied between the LED's 18 and the fiber optic cover 24. Preferably, the gel is polydimethyl siloxane which has a refractive index of 1.465.

The assemblies 10 are made up of a plurality of monoliths 16 each having a diagonal cut at both of its ends 26 thereof. The diagonal ends 26 form an angle relative to the longitudinal sides of the monoliths 14, the preferred angle being about 60 degrees.

The advantage of the construction as demonstrated in FIG. 1 is that a high light density is obtained by having the LED's 18 of one row being placed in staggered relationship with the LED's of the adjacent row. More specifically, the two rows of LED's 18 extend longitudinally with the LED's of one row being laterally staggered relative to the LED's of the other row. The staggered arrangement gives the appearance to the surface 12 of a single contiguous line of light. The staggered array of LED's is maintained at the ends 26 of the monolith 16 so that a set of contiguous centers is obtained. More specifically, after a crystal boule is drawn, it has a cylindrical shape. It is then cut into a number of thin wafers having the shape of thin discs. Next, the sites 18 are doped to produce the p-type junction and the metal coating 20 is deposited about the LED's as shown in FIG. 1. The discs are then cut into monoliths with a saw that typically results in a three thousands of an inch cut. With the diagonal cut, none of the sites 18 is damaged and the monolith 16 may be assembled to give the appearance of one continuous assembly having a uniform distribution of LED's along its entire length. Although only two rows of LED's 18 are shown, it will be appreciated that a larger number of rows may be included. Another way of obtaining the diagonal cut is to cut the monoliths through laser scoring. By driving a laser with a stepper motor controlled by a microprocessor, a plurality of steps would be formed that would match a plurality of steps on an adjacent monolith. The monoliths would then be assembled as described previously.

The advantage achieved in using the fiber optic cover 24 at the face of the LED's 18 is that columner light is transmitted to the surface 12. A light source such as an LED tends to form a divergent light cone as a result of the light passing through air. By using the fiber optic cover 24 and a gel 28 whose refractive index is greater than that of air, it has been found that the light gathering properties are enhanced and the loss of light is reduced. Furthermore, the fiber optic cover 24 provides a degree of protection to the LED's which are rather fragile, especially at the bond connection with the leads 22. This is particularly critical since the LED's must be placed close to the receiving surface 12 in order to enhance resolution.

Figure 3:
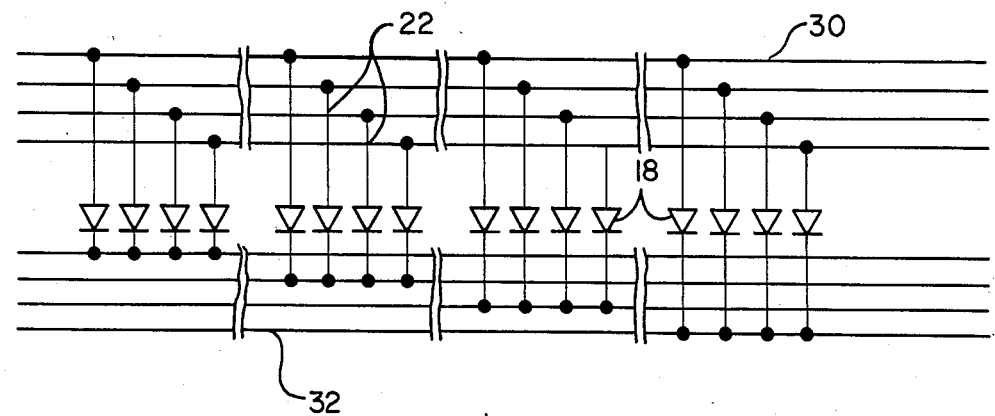
FIG. 3 shows a portion of circuitry involved in enabling the LED's of the assembly shown in FIG. 1.

Referring to FIG. 3, a portion of the circuit used to control input to the LED's 18 on a selective basis is shown. A set of anode rails or bus bars 30 are shown with the individual leads or tapes 22 providing connection between the bus bars and the LED's 18, there being a bus bar for each LED in a monolith. A set of cathode rails or bus bars 32 is also provided, each bus bar 32 being connected in paralled to all the LED's 18 of a given monolith 16. Appropriate controls may be utilized to selectively enable the LED sites 18, but such controls do not form part of the instant invention and will not be described.

What is claimed is:

1. An assembly having a plurality of light emitting diodes, comprising: a plurality of generally longitudinally extending monoliths, means for attaching said monoliths in tandem, each of said monoliths having longitudinally opposed ends that form an angle of other than 90° relative to the longitudinal side of said monolith, said monoliths having two rows of laterally opposed LED sites extending longitudinally thereon, electrical connection means for providing selective enabling of said LED sites, the LED sites of one row being laterally staggered relative to the LED sites of the other row, such that said assembled monoliths define a set of contiguous centers of LED sites.

2. The assembly of claim 1 wherein said angle is about 60 degrees.

* * * * *

UNITED STATES PATENT AND TRADEMARK OFFICE
CERTIFICATE OF CORRECTION

PATENT NO. : 4,728,999
DATED : March 1, 1988
INVENTOR(S) : Hugh St. L. Dannatt et al It is certified that error appears in the above—identified patent and that said Letters Patent is hereby corrected as shown below:

Col. 1, line 60: "of centers" should be --of contiguous centers--.

Col. 2, line 44: "to produce" should be --to provide--.

Col. 2, line 67: "monoliths 14" should be --monoliths 16--.

Signed and Sealed this

Thirteenth Day of December, 1988

Attest:

DONALD J. QUIGG

*Attesting Officer*     *Commissioner of Patents and Trademarks*